US009287312B2

United States Patent
Kao et al.

(10) Patent No.: US 9,287,312 B2
(45) Date of Patent: Mar. 15, 2016

(54) IMAGING SENSOR STRUCTURE AND METHOD

(71) Applicant: Taiwan Semiconductor Manufacturing Company, Ltd., Hsin-Chu (TW)

(72) Inventors: Min-Feng Kao, Chiayi (TW); Dun-Nian Yaung, Taipei (TW); Jen-Cheng Liu, Hsin-Chu (TW); Chun-Chieh Chuang, Tainan (TW); Feng-Chi Hung, Hsin-Chu (TW); Shu-Ting Tsai, Kaohsiung (TW); Jeng-Shyan Lin, Tainan (TW); Shuang-Ji Tsai, Tainan (TW); Wen-I Hsu, Tainan (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 82 days.

(21) Appl. No.: 14/144,121

(22) Filed: Dec. 30, 2013

(65) Prior Publication Data

US 2014/0264683 A1 Sep. 18, 2014

Related U.S. Application Data

(60) Provisional application No. 61/799,822, filed on Mar. 15, 2013.

(51) Int. Cl.
*H01L 27/146* (2006.01)
(52) U.S. Cl.
CPC .... *H01L 27/14636* (2013.01); *H01L 27/14641* (2013.01)

(58) Field of Classification Search
CPC .................. H01L 27/14636; H01L 27/14687
USPC .................................................. 257/E21.597
See application file for complete search history.

(56) References Cited

U.S. PATENT DOCUMENTS

| 8,049,256 | B2 * | 11/2011 | Guidash | 257/292 |
|---|---|---|---|---|
| 9,059,061 | B2 | 6/2015 | Kao et al. | |
| 2013/0285180 | A1 * | 10/2013 | Wang et al. | 257/432 |
| 2014/0042298 | A1 * | 2/2014 | Wan et al. | 250/208.1 |
| 2014/0117470 | A1 * | 5/2014 | Baskaran et al. | 257/415 |

* cited by examiner

*Primary Examiner* — Peniel M Gumedzoe
*Assistant Examiner* — Christopher Johnson
(74) *Attorney, Agent, or Firm* — Haynes and Boone, LLP

(57) ABSTRACT

The present disclosure provides an embodiment of a method for fabricating a three dimensional (3D) image sensor structure. The method includes providing to an image sensor substrate having image sensors formed therein and a first interconnect structure formed thereon, and a logic substrate having a logic circuit formed therein and a second interconnect structure formed thereon; bonding the logic substrate to the image sensor substrate in a configuration that the first interconnect structure and second interconnect structure are sandwiched between the logic substrate and the image sensor substrate; and forming a conductive feature extending from the logic substrate to the first interconnect structure, thereby electrically coupling the logic circuit to the image sensors.

20 Claims, 10 Drawing Sheets

IMAGING SENSOR STRUCTURE AND METHOD

CROSS-REFERENCE

This application claims the benefit of U.S. Provisional Application 61/799,822 entitled "STRUCTURE AND METHOD FOR 3D CMOS IMAGE SENSOR," filed Mar. 15, 2013, herein incorporated by reference in its entirety.

The present disclosure is related to the following commonly-assigned U.S. patent application, the entire disclosures of which is incorporated herein by reference: U.S. patent application Ser. No. 14/143,848 filed on Dec. 30, 2013, for inventors Min-Feng Kao, etc. for "STRUCTURE AND METHOD FOR 3D IMAGE SENSOR."

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component or line that can be created using a fabrication process) has decreased. This scaling down process generally provides benefits by increasing production efficiency and lowering associated costs.

As one application, imaging sensors are incorporated in an integrated circuit. The existing imaging sensor has logic and pixel array on the same Si wafer and another wafer is a carrier only. Various issues may present in the existing imaging sensor structure. In one example, process tuning to image sensors impacts logic circuit area. In another example, small pixel layout suffers low quantum efficiency (QE) and full well capacity (FWC) due to devices occupancy. In yet another example, image signal processor (ISP) seizes a larger layout area, leading to low gross die count per unit area.

Therefore, what is needed is a structure for imaging sensor and method making the same to address the above issues.

BRIEF DESCRIPTION OF THE DRAWINGS

The present disclosure is best understood from the following detailed description when read with accompanying figures. It is emphasized that, in accordance with the standard practice in the industry, various features are not drawn to scale and are used for illustration purpose only. In fact, the dimension of the various features may be arbitrarily increased or reduced for clarity of discussion.

DETAILED DESCRIPTION

Figure 2:
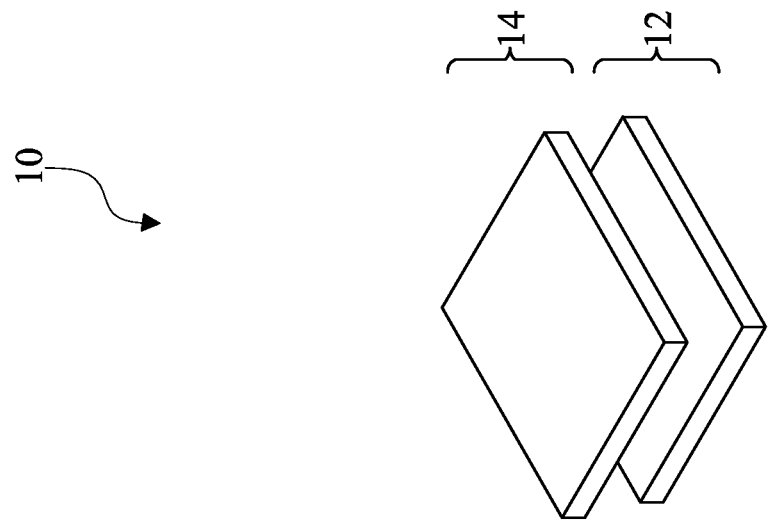
FIGS. 1 and 2 illustrate an imaging sensor structure in a top view and a schematic view, respectively, constructed according to various embodiments.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

The present disclosure provides an imaging sensor structure and the method making the same with improved pixel performance, increased gross die count and enhanced image signal processor (ISP) function.

Figure 1:
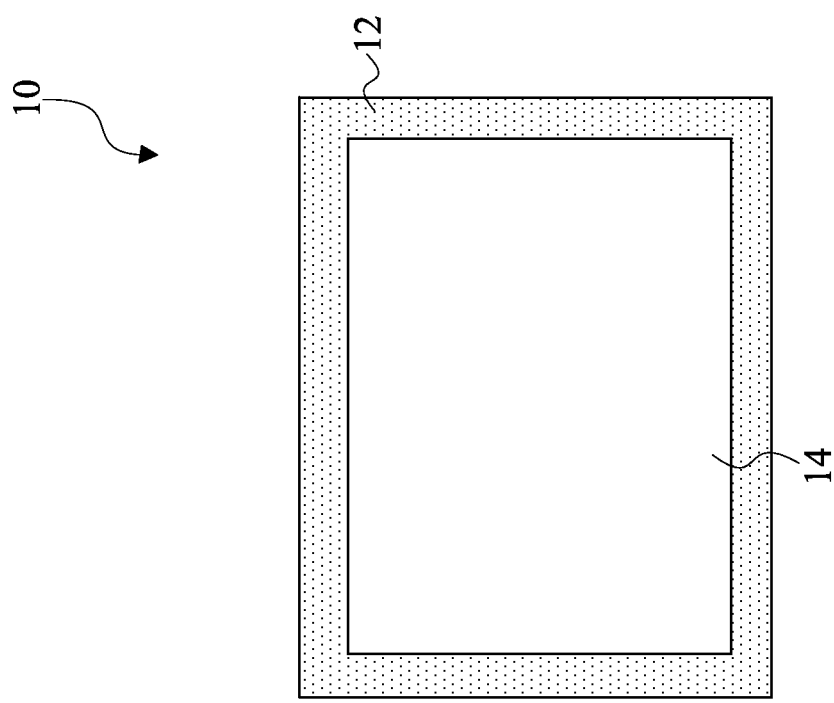

FIG. 1 illustrates a top view of an image sensor structure 10 and FIG. 2 illustrates a schematic view of the image sensor structure 10. The image sensor structure 10 has a three dimensional (3D) structure that includes a first integrated circuit (IC) chip 12 and a second IC chip 14. The IC substrate 14 is stacked on, mechanically bonded to, and electrically coupled with the first IC chip 12. The first IC chip 12 is designed and configured to form various image sensors and the second IC chip 14 is designed and configured to form various driving circuit and logic devices to the image sensors. The first and second IC chips are also referred to as image sensor chip and logic circuit chip, respectively.

The first IC chip 12 includes a first substrate. In one embodiment, the first substrate includes silicon. The first substrate may additionally or alternatively include some other suitable elementary semiconductor, such as diamond or germanium; a suitable compound semiconductor, such as silicon carbide, indium arsenide, or indium phosphide; or a suitable alloy semiconductor, such as silicon germanium carbide, gallium arsenic phosphide, or gallium indium phosphide.

The first IC chip 12 includes various doped regions, and other features configured to form image sensors that are sensitive to photon or other image radiation. In one embodiment, the image sensors include photodiodes, such as complementary metal-oxide-semiconductor field-effect transistor (CMOSFET)-based photodiodes or other photosensitive devices. In one embodiment, those image sensors are further configured to form an image sensor array for various applications including imaging. In one example, the image sensors are backside illuminated CMOSFET-based image sensors, where the illumination beam is received from the backside of the image sensors. Accordingly, the first IC chip 12 is also referred to as image sensor chip 12. The first IC chip 12 includes conductive material features and dielectric material features disposed on the first substrate and configured for coupling and isolating various microelectronic components, respectively. As one example, the first IC chip 12 includes one or more material layers, such as interleave dielectric material layers (ILDs) and metal layers that are embedded in the ILDs and are patterned to form metal lines, vias and contacts. In another embodiment, the first IC chip 12 may further include other microelectronic devices.

The second IC chip 14 includes a second substrate. In the present embodiment, the second substrate is substantially similar to the first substrate. In one example, the second substrate includes silicon. In other examples, the second substrate alternatively or additionally includes some other suitable elementary semiconductor, a suitable compound semiconductor, or a suitable alloy semiconductor.

The second IC chip 14 includes various microelectronic devices, such as CMOSFET-based logic devices and circuits. Particularly, the second IC chip 14 includes various microelectronic devices configured to form driving circuits/devices for the image sensors. In one embodiment, the driving circuits to the image sensors include address lines and data lines to the image sensor array. The driving circuits to the image sensors further include driving devices reset (RST) device, source follower (SF), and row selector (RS). In the present embodiment, those driving devices are configured in group to be coupled with one pixel of the image sensors or a subset of the pixels. Various circuits and devices formed in the second IC chip 14 are collectively referred to as logic devices in the later description. In one example, the second IC chip is an application-specific integrated circuit (ASIC) chip.

The first IC chip 12 and the second IC chip 14 are mechanically bonded together through a suitable bonding mechanism, such as fusion bonding, eutectic bonding or other suitable bonding technique. The first IC chip 12 and the second IC chip 14 are electrically coupled together through backside deep contact (BDCT) features. The BDCT features are formed in the deep trenches in the interconnect structure of the first IC chip 12, are further extended to the interconnect structure of the second IC chip 14, are configured with other conductive features to electrically couple together the driving devices in the second IC chip 14 and the image sensors in the first IC chip 12. The BDCT features will be further described later in terms of the formation and configuration. Since the image sensors and the corresponding driving circuits/devices are distributed into two IC chips (12 and 14 in the present embodiment), there are more freedom and flexibility to reconfigure and tune the image sensors and the driving circuits/devices for improved performance and efficiency. For example, the image sensors and the logic devices are individually tuned for their performance during the respective fabrication operations before bonding and coupling together. In the present embodiment, the 3D image sensor structure 10 is formed by a procedure where the first IC chip 12 and the second IC chip 14 are fabricated and bonded in wafer level and thereafter are diced to separate a plurality of the 3D image sensor structures 10. In an alternative embodiment, the coupling between the first and second IC chips is achieved by a through-semiconductor via (or through-silicon via, or TSV) feature, which is different from the BDCT feature in terms of configuration and formation.

Figure 3:
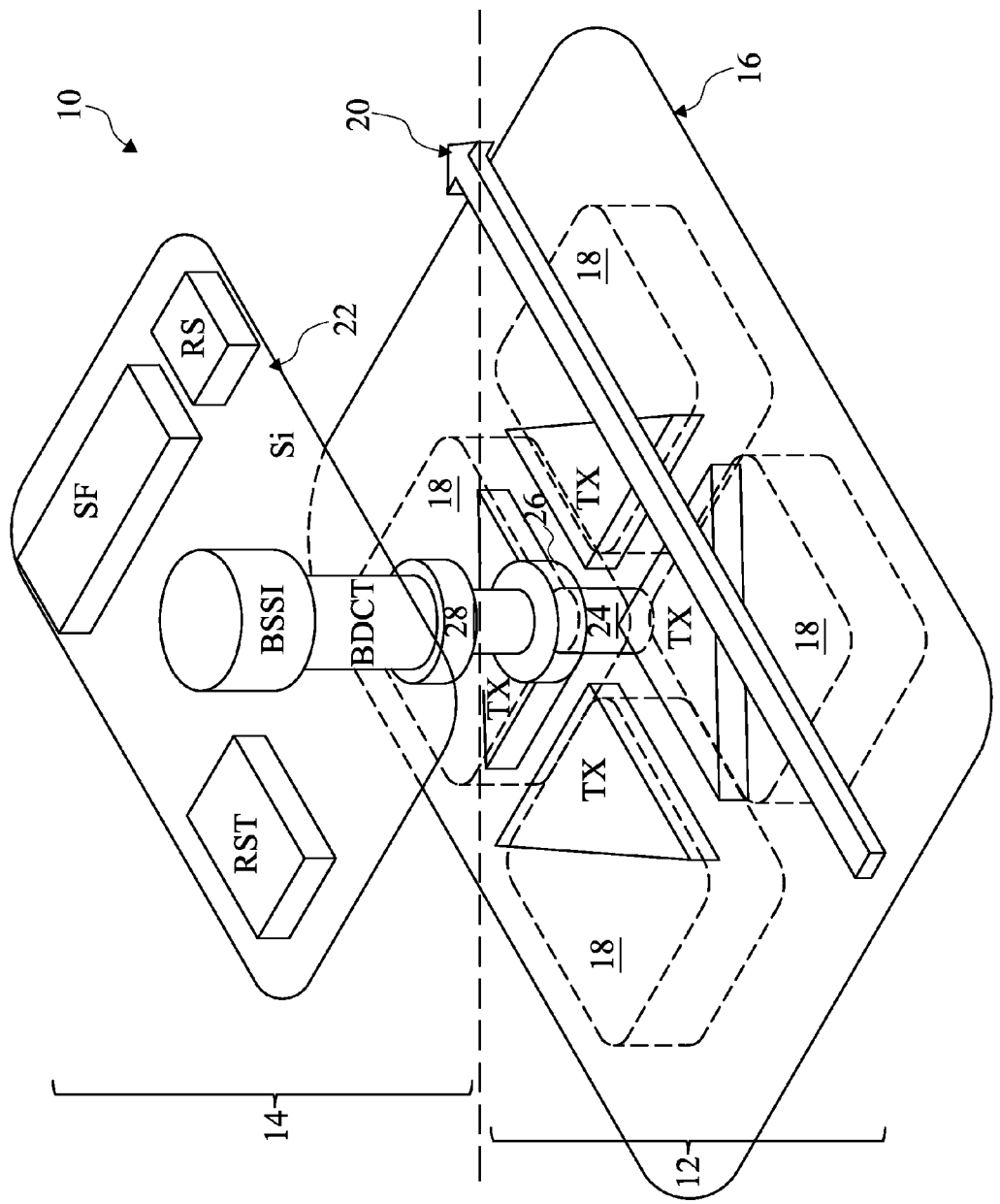
FIG. 3 illustrates a schematic view of the imaging sensor structure constructed according to another embodiment.

FIG. 3 illustrates a schematic view of the 3D image sensor structure 10 constructed according to aspects of the present disclosure in another embodiment. The 3D image sensor structure 10 includes the first IC chip 12 and the second IC chip 14 mechanically bonded together and electrically coupled with each other. The first IC chip 12 is designed and configured to form various image sensors and the second IC chip 14 is designed and configured to form various logic circuits that include driving circuit/devices to the image sensors.

The first IC chip 12 includes a first substrate 16. In one embodiment, the first substrate includes silicon. The first substrate may additionally or alternatively include some other suitable elementary semiconductor; a suitable compound semiconductor; or a suitable alloy semiconductor.

The first IC chip 12 includes various doped regions, and other features configured to form image sensors 18 that are sensitive to photon or other image radiation. In one embodiment, the image sensors 18 include photodiodes, such as CMOSFET-based photodiodes or other photosensitive devices. In one example, the image sensors are backside illuminated CMOSFET-based image sensors. In the present embodiment, the first IC chip 12 also includes other features, such as transfer gates ("TX" in FIG. 3) formed on the photodiodes 18, respectively. The first IC chip 12 includes an interconnect structure (also referred to as a first interconnect structure) formed on the first substrate 16. The first interconnect structure includes metal lines, vias and contacts to provide horizontal and vertical electrical routing. The interconnect structure may include a plurality of metal layers, such as a first metal layer a second metal layer, . . . and so on. The first interconnect structure includes various conductive features configured to an electrical routing 20 to provide electrical routing to the transfer gates.

The second IC chip 14 includes a second substrate 22. In the present embodiment, the second substrate 22 is substantially similar to the first substrate 16. For examples, the second substrate includes silicon.

The second IC chip 14 includes various microelectronic devices, such as CMOSFET-based logic devices formed on the second substrate 22. Particularly, the second IC chip 14 includes various microelectronic devices configured to drive the image sensors 18. In one embodiment, the driving devices to the image sensors include reset (RST) device, source follower (SF), and row selector (RS). In the present embodiment, those driving devices are configured in pixel levels such that a group of those devices are coupled with one pixel of the image sensors 18 or a subset of pixels in the image sensor array. Accordingly, the coupling between the driving devices to the image sensors are pixel-based and the conductive features to connect both need to be properly designed and configured to provide such capability with chip area efficiency.

The second IC chip 14 also includes an interconnect structure (also referred to as a second interconnect structure) formed on the second substrate 22. The second interconnect structure includes a plurality of metal layers, such as a first metal layer, a second metal layer, . . . , and the top metal layer. One of the metal lines in the top metal layer is illustrated in FIG. 3.

The first IC chip 12 and the second IC chip 14 are mechanically bonded together through a suitable bonding mechanism. The first IC chip 12 and the second IC chip 14 are electrically coupled together through one or more backside deep contact ("BDCT" in FIG. 3) feature. The BDCT feature is formed in the deep trenches in the interconnect structure of the first IC chip 12, further extended to the interconnect structure of the second IC chip 14, and configured with other conductive features to electrically couple together the driving devices in the second IC chip 14 and the image sensors 18 in the first IC chip 12.

The BDCT feature has a small dimension in a top view toward the first or second substrate since it is pixel-based with small footprint. In one example, the dimension of the BDCT feature is less than 1 micron. Particularly, the BDCT feature is extended from the contact feature 24 of the first interconnect structure in the first substrate 16 to a conductive feature (referred to as "BSSI" feature in FIG. 3) formed in the second substrate 22. The BSSI feature is embedded in the second substrate 22 and formed by backside silicon (BSSI) etch. The BDCT feature is extended through a first metal line in the first metal layer and a second metal line in the top metal layer of the second interconnect structure. In the present embodiment, the BDCT has different dimensions in different portions. The BDCT includes a first portion between the BSSI feature and the second metal line, and a second portion between the second metal line and the first metal line. The first portion has a first dimension (first width) and the second portion has a second dimension (second width) less than the first dimension, as illustrated in FIG. 3. This structure can be achieved by a procedure including multiple etchings.

Figure 4:
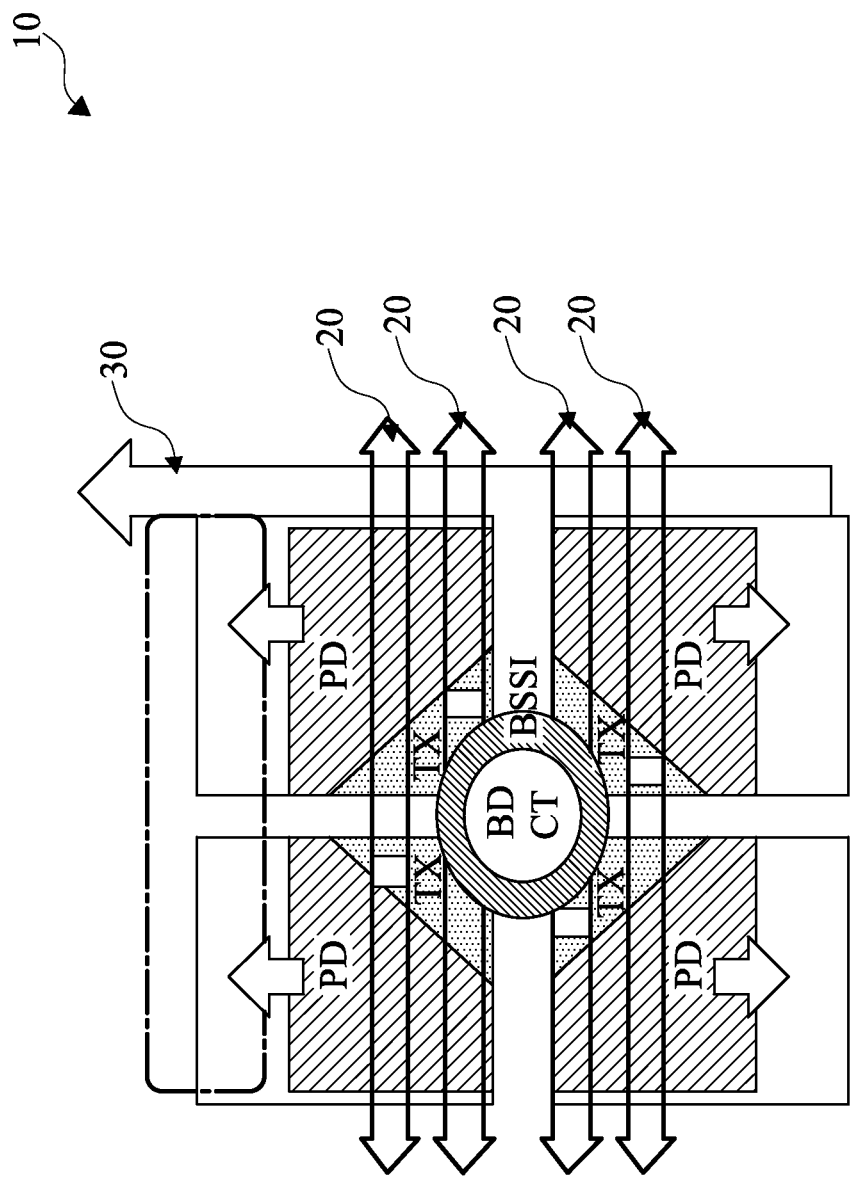
FIG. 4 illustrates a schematic view of the imaging sensor structure constructed according to another embodiment.

As noted above, the image sensors and the corresponding driving devices are respectively formed on two IC chips, with more freedom and flexibility to reconfigure and tune the image sensors and the driving devices for improved performance and efficiency. One such example of the 3D image sensor structure 10 is illustrated in FIG. 4 in a schematically top view. The 3D image sensor structure 10 includes photodiodes ("PD") and transfer gates ("TX") formed on the first IC chip. The first IC chip is mechanically bonded and is further electrically coupled with the second IC chip through the BDCT feature and BSSI feature. The BDCT and BSSI features are formed by a 3D procedure on the backside of the second IC chip, which will be further described later. The signal lines 20 and ground line 30 of the photodiodes are configured on the pixel edges and are electrically coupled to the logic circuit/devices through BDCT feature in the 3D connection.

Figure 5:
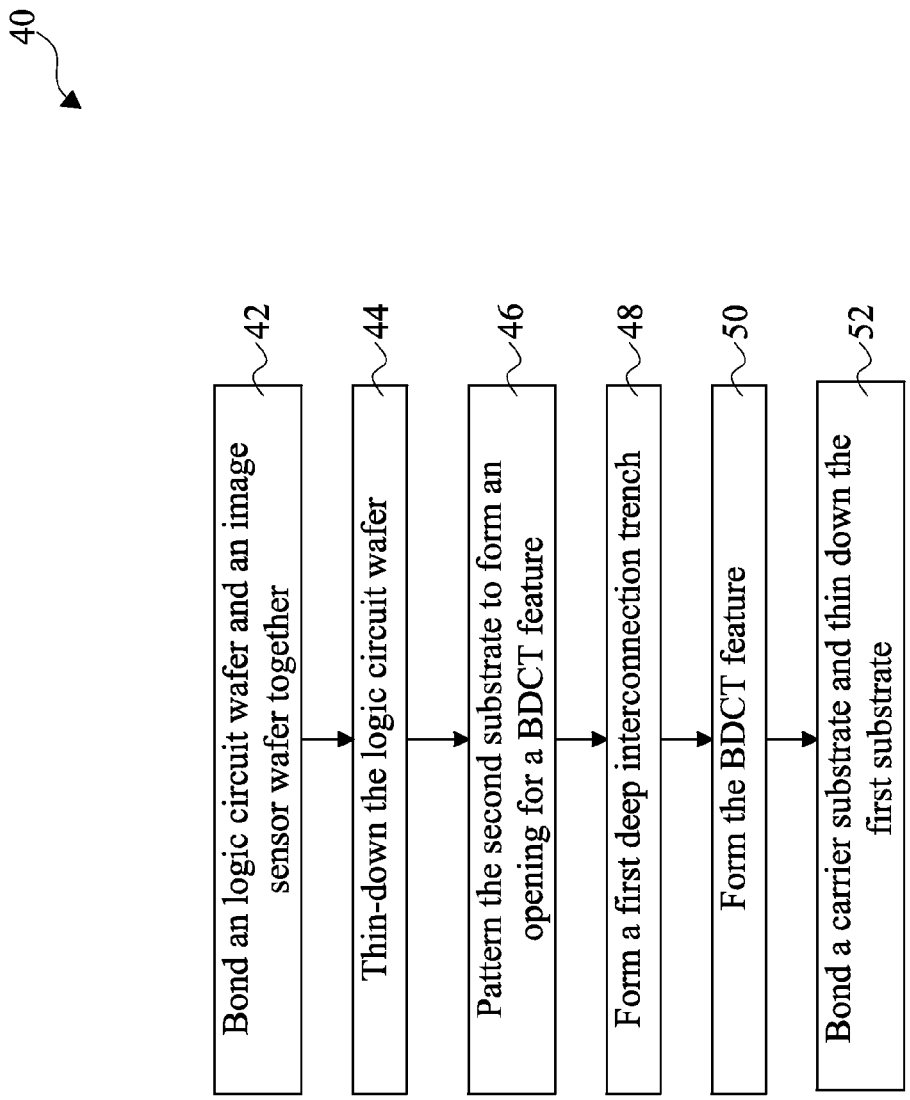
FIG. 5 is a flowchart of a method making the imaging sensor structure constructed according to one or more embodiment.

FIG. 5 is a flowchart of a method 40 making the 3D image sensor structure 10, and FIGS. 6-12 illustrates the 3D image sensor structure 10 at various fabrication stages constructed according one or more embodiment. As one embodiment, the present method 40 is implemented in wafer-level with more efficiency and multiple 3D image sensor chips are separated by dicing after the bonding and the formation of the electrical coupling features.

Figure 7:
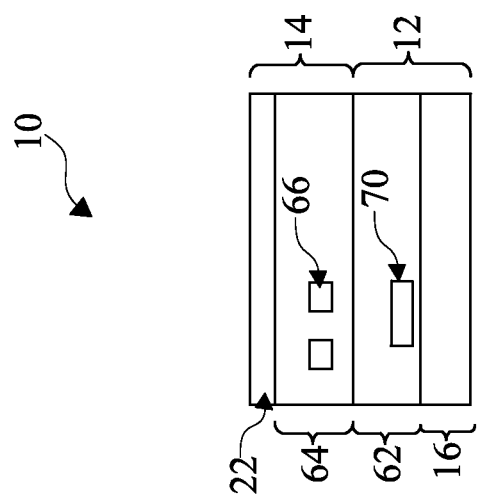
Figure 6:
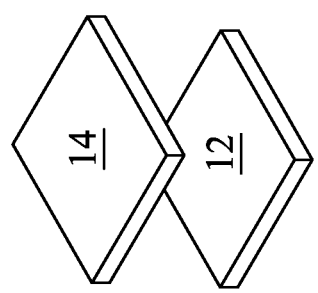
FIG. 6 illustrates a schematic view of the logic circuit structure and an image sensor chip constructed according to one embodiment.

Referring to FIGS. 5-7, the method 40 begins at operation 42 by bonding the first IC structure (image sensor wafer) 12 and the second IC structure (logic circuit wafer) 14 together resulting in a bonded 3D image sensor structure 10. The first IC structure 12, as described above, includes a plurality of photosensitive devices, such as photodiodes, formed thereon. The image sensor chip 12 includes a semiconductor substrate 16, such as silicon wafer. The image sensor structure 12 further includes image sensors formed in the semiconductor substrate 16. The image sensor structure 12 also includes a first interconnect structure 62 having various metal lines, vias and contacts formed in various interlayer dielectric (ILD) material layers. A metal line 70 in the first metal layer of the first interconnect structure is illustrated in FIG. 7.

In the present embodiment, the second IC structure 14 is an ASIC wafer. Particularly, the second IC structure 14 includes a semiconductor substrate 22, such as a silicon wafer, and a logic circuit of various logic devices formed on the semiconductor substrate 22. The logic devices include CMOSFET-based devices for various logic functions and driving devices, such as RST, SF and RF, to be coupled to the image sensors.

The second IC structure 14 includes a second interconnect structure 64 formed on the semiconductor substrate 22. The interconnect structure 64 includes various metal lines (in respective metal layers), vias and contacts configured to provide electrical routing and coupled with the logic devices. The formation of the interconnect structure 64 (or the interconnect structure 62) includes a suitable procedure, such as damascene process for copper connection. In this method, the interlayer dielectric material layer is deposited, and patterned to form trenches using lithography process and etch. The metal, such as copper, is deposited to fill in the trenches and is further polished to remove the excessive and planarize the top surface by chemical mechanical polishing (CMP). The metal deposited to the trenches may include barrier layer (such as titanium nitride or tantalum nitride) by physical vapor deposition (PVD), copper seed layer by PVD and bulk copper by plating. In FIG. 7, metal features 66 in the top metal layer are illustrated.

The bonding process is designed to bond the two IC structure in a configuration such that the two interconnect structures are sandwiched between the two semiconductor substrates. Particularly, in the 3D image sensor structure, the first interconnect structure 62 and the second interconnect structure 64 are sandwiched between the two substrates 16 and 22. The bonding process may implement a suitable bonding mechanism, such as fusion bonding, eutectic bonding, or other bonding technique.

The method 40 may include an operation 44 by thinning down the second substrate 22 such that the thickness of the semiconductor substrate 22 (silicon wafer in the present case) is reduced. The thinning down process may include a suitable polishing or grinding process, such as a chemical mechanical polishing (CMP).

Figure 8:
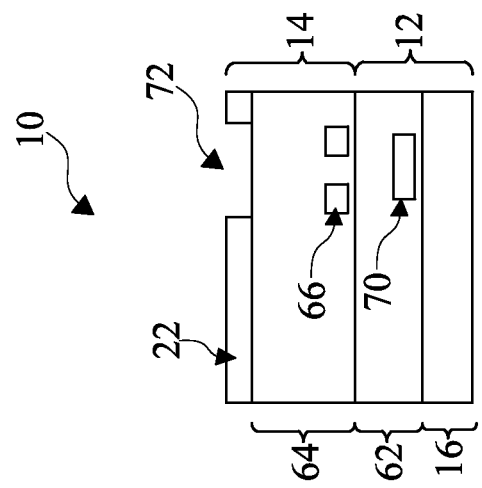
FIGS. 7-12 illustrate sectional views of the imaging sensor structure at various fabrication stages constructed according to one or more embodiments.

Referring to FIGS. 5 and 8, the method 40 proceeds to operation 46 by patterning the second substrate 22 to form one (or more) opening 72 that defines the region for the BDCT feature. The through opening 72 of the semiconductor substrate 22 exposes the second interconnect structure 64 within the opening. The patterning process includes a lithography process and etching. In one example, the lithography process includes coating photoresist layer on the semiconductor substrate 22; performing a lithography exposure to the photoresist layer; and developing the exposed photoresist layer to form a patterned photoresist layer. The etching is designed to selectively etch the semiconductor substrate 22, (selectively etch silicon in the present embodiment). In another embodiment of patterning the second substrate 22, a hard mask may be employed. For example, a hard mask layer is deposited on the semiconductor substrate 22, a patterned photoresist layer is formed by a lithography process, an etching process is applied to the hard mask layer using the patterned photoresist layer as an etch mask, and thereafter, another etching process is applied to the second substrate 22 using the patterned hard mask layer as an etch mask. In yet another example, the lithography process may include other suitable technologies, such as ultraviolet (UV) lithography, deep UV (DUV) lithography, extreme UV (EUV) lithography, or electron-beam lithography. In yet another example, the lithography process may be replaced by other suitable technologies, such as molecular imprint or maskless lithography.

Figure 9:
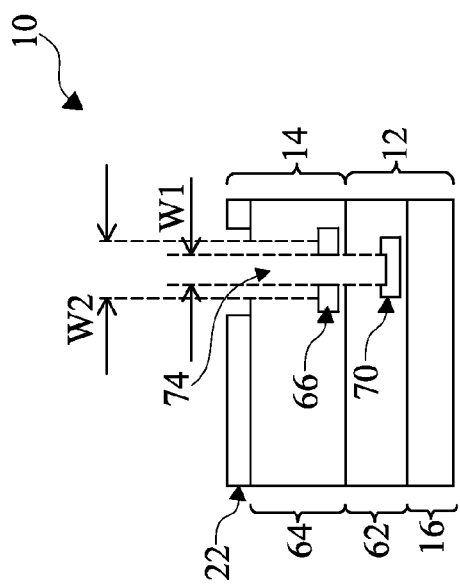

Referring to FIGS. 5 and 9, the method 40 proceeds to operation 48 by forming one or more deep interconnect trench 74 for backend deep contact. The deep interconnect trench 74 vertically extends from the second IC structure 14 to the first IC structure 12. Especially, the deep interconnect trench 74 extends from the second interconnect structure 64 of the second IC structure 14 to the first interconnect structure 62 of the first IC structure 12. The deep interconnect trench 74 includes a first trench portion and a second trench portion with different dimensions. The first trench portion vertically spans between the metal line 70 in the first metal layer of the first interconnect structure and the metal line 66 in the top metal layer of the second interconnect structure. The second trench portion is in the second IC structure and vertically spans from the metal line 66 in the top metal layer of the second interconnect structure to the second substrate 22. In the present example, the first trench portion has a first horizontal dimension (first trench width) W1 and the second trench portion has a second horizontal dimension (second trench width) W2 greater than W1, thereby providing more room for the image sensors in the first IC structure 12.

The deep interconnect trench 74 is aligned with the metal lines 66 and 70, and therefore electrically couple the metal lines 66 and 70 together by the corresponding BDCT feature to be formed, thereby providing the electrical interconnection between the first and second IC structures, particularly providing the electrical interconnection between the image sensors in the first IC structure 12 and the logic devices in the second IC structure 14.

The formation of the deep interconnect trench 74 includes various etching processes. Since the second interconnect structure includes various metal features formed in one or more ILD material layers. The ILD material layers includes a suitable dielectric material, such as silicon oxide, silicon nitride, silicon oxynitride, polyimide, spin-on glass (SOG), fluoride-doped silicate glass (FSG), carbon doped silicon oxide, and low k dielectric material. The etching processes are designed to selectively etch the ILD material layers.

In one embodiment, the formation of the deep interconnect trench is similar to the dual damascene process, such as via-first dual damascene process, trench-first dual damascene process or other suitable dual damascene process. In furtherance of the embodiment, the metal lines 66 and 70 may serve as etch stop layers in the etch processes to form the first and second trench portions, respectively.

The formation of the deep interconnect trench 74 in a particular example is described below. The first etch process is applied to the ILD layers to form the second trench portion of the deep interconnect trench 74 through the opening 72 in the second semiconductor substrate 22 using the semiconductor substrate 22 as an etch mask. The opening 72 may be expanded to a large size during the first etch process. The first etch process is designed with an etchant to selectively remove the dielectric material of the ILD material layers and to stop on the metal line 66. A second etch process is applied to the metal line 66 to open the metal line 66 within the trench. Thereafter, a processing procedure including lithography process and etch is applied to form the first trench portion. In the processing procedure, a patterned photoresist layer is formed on the semiconductor substrate 22 and in the second trench portion by a lithography process. The lithography process includes photoresist coating, exposure and developing, and may further include various baking steps, such as soft baking, post exposure baking and hard baking. The patterned photoresist layer includes an opening that defines the region for the first trench portion. A third etching process is applied to etch the ILD dielectric material layer of the second interconnect structure and the ILD dielectric material layer of the first interconnect structure. In one example, the third etching process is similar to the first etching process in terms of the etchant and etches selectivity. In furtherance of the example, the third etching process stops on the metal line 70. Other suitable procedure that is able to form the deep interconnect trench 74 may be implemented. For example, additional etch stop layer may be formed on the metal lines 70 (or 66) to stop the corresponding etch process for forming the first trench portion (or the second trench portion), to enhance the etch control.

Figure 10:
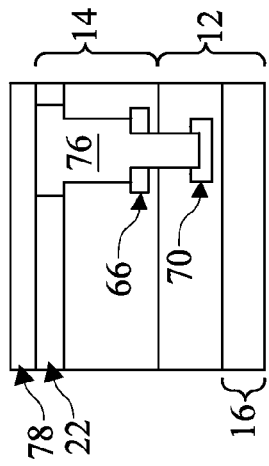

Referring to FIGS. 5 and 10, the method 40 proceeds to operation 50 by forming the BDCT feature 76. In one embodiment, the formation of the BDCT feature 76 is similar to the formation of metal features by the dual damascene process. In furtherance of the embodiment, the formation of the BDCT feature 76 includes filling the deep interconnect trench 74 with one or more conductive material; and performing a CMP process to remove the excessive metal deposited on the second substrate 22 and planarize the top surface. In various examples, the conductive material includes metal or metal alloy, such as copper, tungsten, metal silicide, aluminum or other suitable conductive material. In another example, the conductive material may include more than one material layers. The conductive material may be deposited by a suitable technique, such as physical vapor deposition (PVD), plating, chemical vapor deposition (CVD). In the present example, the BDCT feature 76 includes a barrier layer, such as titanium nitride or tantalum nitride deposited by PVD; a copper seed layer formed on the barrier layer by PVD; and bulk copper to fill in the deep interconnect trench by plating.

In the present embodiment, during the formation of the BDCT feature 76, the opening 72 of the second substrate 22 is also filled with the conductive material, thereby forming another conductive portion in the opening 72. The portion of the conductive material in the opening 72 is collectively labeled by numeral 76 in FIG. 13 (it is also referred to as the BSSI feature in FIG. 3).

Additionally, a passivation layer 78 is formed on the substrate 22 and the BDCT feature 76. The passivation layer 78 includes a suitable material for passivation, such as a silicon oxide layer, a silicon nitride or a combination thereof, formed by a suitable method, such CVD.

Figure 11:
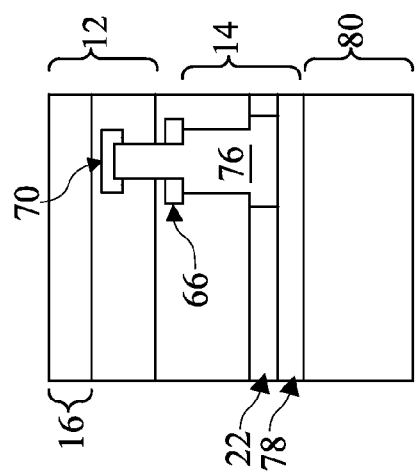

Referring to FIGS. 5 and 11, the method 40 may include an operation 52 by bonding a carrier substrate 80 (such as another silicon wafer) to the 3D image sensor structure 10 if it is too thin without enough mechanical strength. In one example, the second substrate 22 is too thin. The carrier substrate 80 is boned to the second substrate to the passivation layer 80 by a suitable bonding mechanism, such as fusion bonding or eutectic bonding.

Figure 12:
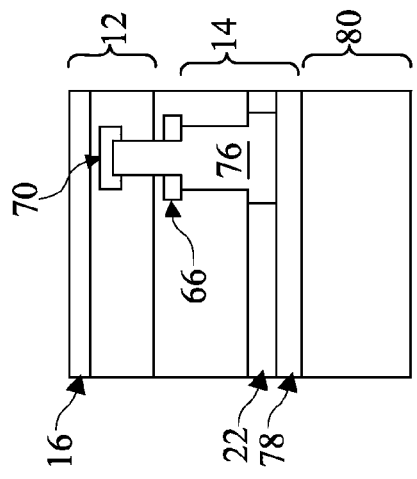

Referring to FIGS. 5 and 12, the operation 52 may include a thinning-down process after the bonding of the carrier substrate 80. The first substrate 16 is thinned down from the backside such that the thickness of the first substrate 16 is substantially reduced. Thereby, the image sensors formed in the first substrate 16 are able to receive image light more efficiently with reduced energy loss.

The method 40 may further include other operations to complete the formation of the 3D image sensor structure 10. In one example, the method 40 may include forming various features to enhance the imaging effect of the image sensors, such as forming color filter and micro-lenses on the backside of the first substrate. In another example, the method 40 may include a dicing process to form a plurality of 3D image sensor chips after the above operations are implemented in wafer level.

The present disclosed 3D image sensor structure and the method making the same are described in various embodiments. In another embodiment, the carrier wafer as the third substrate bonded to the 3D image sensor structure includes other logic circuit for further ISP function enhancement. For example, various logic devices including the driving devices to the image sensors are properly distributed in the logic substrate and the carrier wafer for more configuration freedom and design flexibility to enhance the performance of the 3D image sensor structure. In another embodiment of the disclosed structure and method, the driving devices to the image sensors are relocated on the logic substrate for image sensor performance improvement, such as the enlargement of quantum efficiency (QE) and full well capacity (FWC). In yet another embodiment, the image sensors in the 3D image sensor structure may be replaced by other sensors to employ the advantages of the 3D structure.

Figure 13:
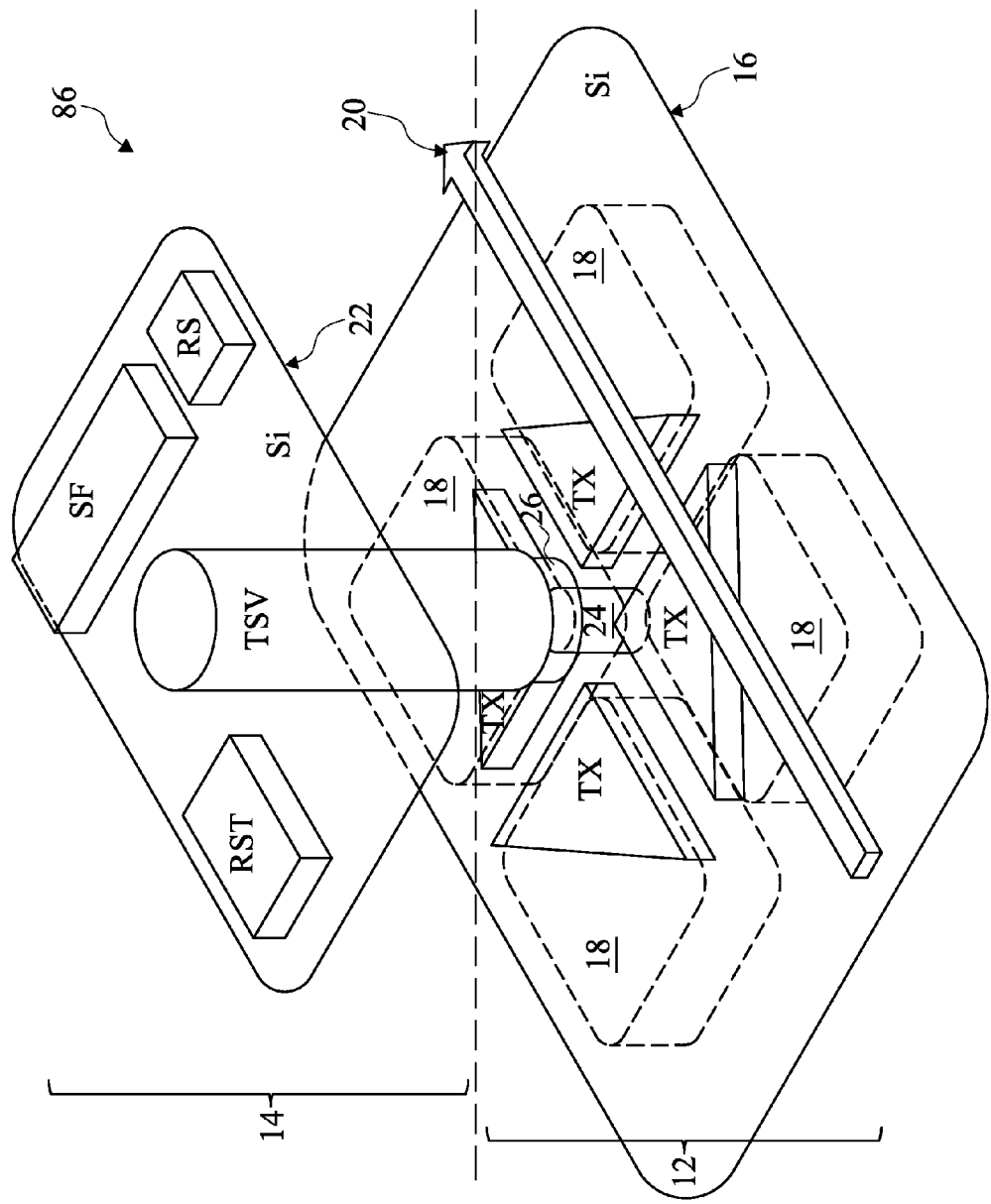
FIG. 13 illustrates a schematic view of an imaging sensor structure constructed according to another embodiment.

FIG. 13 illustrates a schematic view of the 3D image sensor structure 86 constructed according to aspects of the present disclosure in another embodiment. The 3D image sensor structure 86 includes the first IC chip 12 and the second IC chip 14 mechanically bonded together and electrically coupled with each other through a TSV feature ("TSV"). The first IC chip 12 is designed and configured to form various image sensors and the second IC chip 14 is designed and configured to form various logic circuits that include driving circuit/devices to the image sensors.

The first IC chip 12 includes a first substrate 16. In one embodiment, the first substrate includes silicon. the first substrate may additionally or alternatively include some other suitable elementary semiconductor; a suitable compound semiconductor; or a suitable alloy semiconductor.

The first IC chip 12 includes various doped regions, and other features configured to form image sensors 18 that are sensitive to photon or other image radiation. In one embodiment, the image sensors 18 include photodiodes, such as CMOSFET-based photodiodes or other photosensitive devices. In one example, the image sensors are backside illuminated CMOSFET-based image sensors. In the present embodiment, the first IC chip 12 also includes other features, such as transfer gates ("TX") formed on the photodiodes 18, respectively. The first IC chip 12 includes an interconnect structure (also referred to as a first interconnect structure) formed on the first substrate 16. The first interconnect structure includes metal lines, vias and contacts to provide horizontal and vertical electrical routing. The interconnect structure may include a plurality of metal layers, such as a first metal layer, a second metal layer, . . . and so on. Exemplary conductive features 24, 26 and 28 (such as a metal line in one metal layer or a via between adjacent metal layers or a contact between the substrate and the first metal layer) are illustrated in FIG. 3 and FIG. 13. In the present example, the conductive feature 24 is a contact and the conductive feature 26 is a metal line in the first metal layer. The contact 24 and the metal line 26 are directly connected. The first interconnect structure includes various conductive features configured to an electrical routing 20 to provide electrical routing to the transfer gates.

The second IC chip 14 includes a second substrate 22. In the present embodiment, the second substrate 22 is substantially similar to the first substrate 16. For examples, the second substrate includes silicon.

The second IC chip 14 includes various microelectronic devices, such as CMOSFET-based logic devices formed on the second substrate 22. Particularly, the second IC chip 14 includes various microelectronic devices configured to drive the image sensors 18. In one embodiment, the driving devices to the image sensors include reset (RST) device, source follower (SF), and row selector (RS). In the present embodiment, those driving devices are configured in pixel levels such that a group of those devices are coupled with one pixel of the image sensors 18 or a subset of pixels in the image sensor array. Accordingly, the coupling between the driving devices to the image sensors are pixel-based and the conductive features to connect both need to be properly designed and configured to provide such capability with chip area efficiency.

The second IC chip 14 also includes an interconnect structure (also referred to as a second interconnect structure) formed on the second substrate 22. The second interconnect structure includes a plurality of metal layers, such as a first metal layer, a second metal layer, . . . and the top metal.

The first IC chip 12 and the second IC chip 14 are mechanically bonded together through a suitable bonding mechanism. The first IC chip 12 and the second IC chip 14 are electrically coupled together through one or more TSV feature. The TSV feature is formed in the deep trenches in the first interconnect structure of the first IC chip 12 and the second interconnect structure of the second IC chip 14, and further extended to the second substrate 22 of the second IC chip 14, and configured with other conductive features to electrically couple together the driving devices in the second IC chip 14 and the image sensors 18 in the first IC chip 12.

The TSV feature has a greater dimension D width at the first or second substrate compared to the BDCT feature. In one example, the dimension of the TSV feature is about 10 micron. In a particular example, the TSV feature is extended from the metal line 26 of the first interconnect structure in the first substrate 16 to the second substrate 22. In another example, the dimension D of the TSV feature is substantially same from the top portion in the second substrate 22 to the bottom portion in the first interconnect structure of the first IC chip. The TSV feature connects to the metal line 24 and is coupled to the image sensors 18 therethrough. The TSV feature is coupled to the logic circuit in the second IC chip 14 through various metal features. In one embodiment, various conductive features are formed in the backside of the second substrate 22 and are connected to the TSV feature. In another embodiment, the conductive features may be formed in one metal layer (for example, the first metal layer in the second interconnect structure). Therefore, the logic devices are coupled with the image sensors 18 through the TSV feature and those conductive features formed in the second substrate 22. The conductive features in the second substrate 22 may be formed by a procedure that includes lithography patterning, etching, deposition of a barrier layer and metal, and polishing.

As noted above, the image sensors and the corresponding driving devices are respectively formed on two IC chips, with more freedom and flexibility to reconfigure and tune the image sensors and the driving devices for improved performance and efficiency.

Figure 14:
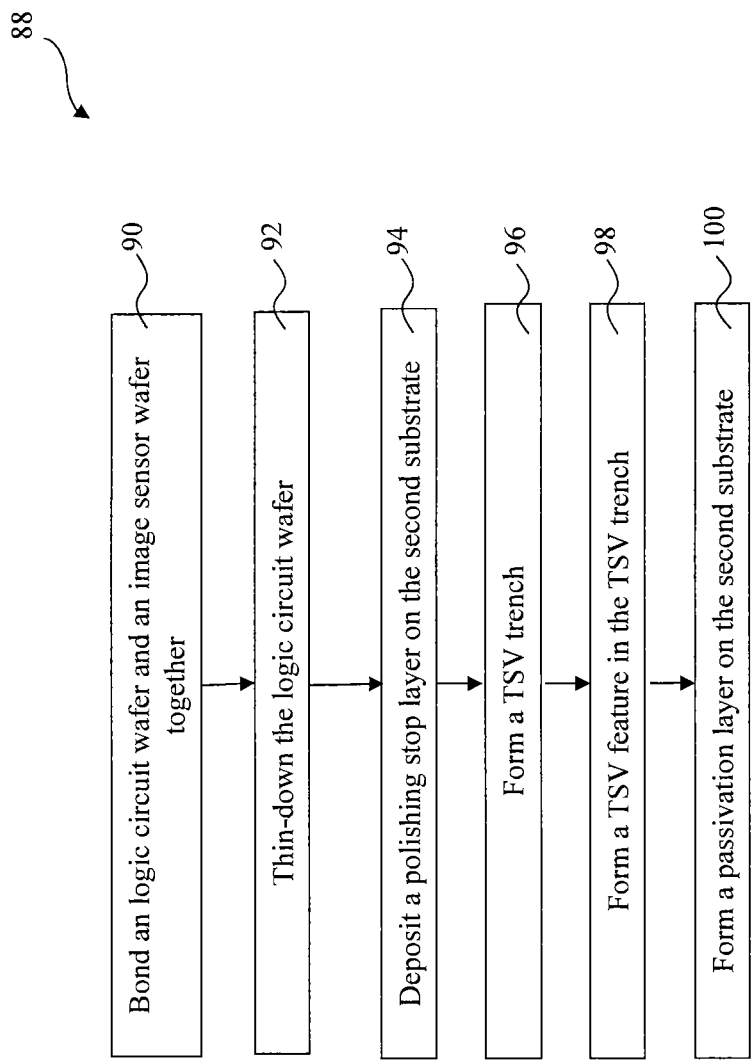
FIG. 14 is a flowchart of a method making the imaging sensor structure of FIG. 13 constructed according to one or more embodiment.

FIG. 14 is a flowchart of a method 88 making the 3D image sensor structure 86, and FIGS. 15-22 illustrates the 3D image sensor structure 86 at various fabrication stages constructed according one or more embodiment. As one embodiment, the present method 88 is implemented in wafer-level with more efficiency and multiple 3D image sensor chips are separated by dicing after the bonding and the formation of the electrical coupling features.

Figure 16:
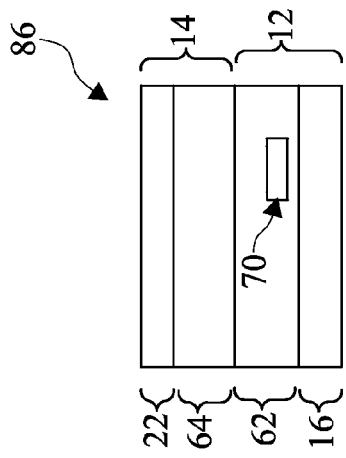
FIGS. 16-22 illustrate sectional views of the imaging sensor structure at various fabrication stages constructed according to one or more embodiments.
Figure 15:
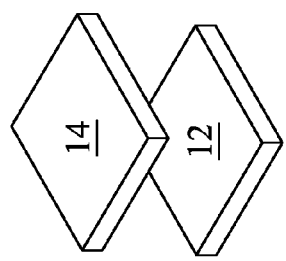
FIG. 15 illustrates a schematic view of the logic circuit structure and an image sensor chip constructed according to one embodiment.

Referring to FIGS. 14-16, the method 88 begins at operation 90 by bonding the first IC structure (image sensor wafer) 12 and the second IC structure (logic circuit wafer) 14 together resulting in a bonded 3D image sensor structure 10. The first IC structure 12, as described above, includes a plurality of photosensitive devices, such as photodiodes, formed thereon. The image sensor chip 12 includes a semiconductor substrate 16, such as silicon wafer. The image sensor structure 12 further includes image sensors formed in the semiconductor substrate 16. The image sensor structure 12 also includes a first interconnect structure 62 having various metal lines, vias and contacts formed in various interlayer dielectric (ILD)

material layers. A metal line 70 of one metal layer in the first interconnect structure is illustrated in FIG. 16.

In the present embodiment, the second IC structure 14 is an ASIC wafer. Particularly, the second IC structure 14 includes a semiconductor substrate 22, such as a silicon wafer, and a logic circuit of various logic devices formed on the semiconductor substrate 22. The logic devices include CMOSFET-based devices for various logic functions and driving devices, such as RST, SF and RF, to be coupled to the image sensors.

The second IC structure 14 includes a second interconnect structure 64 formed on the semiconductor substrate 22. The interconnect structure 64 includes various metal lines (in respective metal layers), vias and contacts configured to provide electrical routing and coupled with the logic devices. The formation of the interconnect structure 64 (or the interconnect structure 62) includes a suitable procedure, such as damascene process for copper connection. In this method, the interlayer dielectric material layer is deposited, and patterned to form trenches using lithography process and etch. The metal, such as copper, is deposited to fill in the trenches and is further polished to remove the excessive and planarize the top surface by chemical mechanical polishing (CMP). The metal deposited to the trenches may include barrier layer (such as titanium nitride or tantalum nitride) by physical vapor deposition (PVD), copper seed layer by PVD and bulk copper by plating.

The bonding process is designed to bond the two IC structure in a configuration such that the two interconnect structures are sandwiched between the two semiconductor substrates. Particularly, in the 3D image sensor structure, the first interconnect structure 62 and the second interconnect structure 64 are sandwiched between the two substrates 16 and 22. The bonding process may implement a suitable bonding mechanism, such as fusion bonding, eutectic bonding, or other bonding technique.

The method 88 may include an operation 92 by thinning down the second substrate 22 such that the thickness of the semiconductor substrate 22 (silicon wafer in the present case) is reduced. The thinning down process may include a suitable polishing or grinding process, such as CMP.

Figure 17:
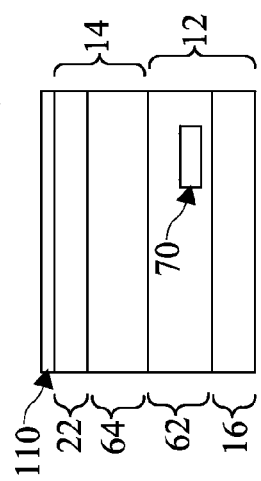

Referring to FIGS. 14 and 17, the method 88 proceeds to operation 94 by depositing a polishing stop layer 110 on the backside of the second substrate 22. The polishing stop layer 110 functions to stop the polishing process during the formation of the TSV feature. In the present embodiment, the polishing stop layer 110 includes silicon carbide or alternatively other suitable material with effective resistance to the polishing process. The polishing stop layer 100 is formed by a suitable deposition technique, such as chemical vapor deposition (CVD). The thickness of the polishing stop layer 110 is designed with enough polishing resistance.

Figure 18:
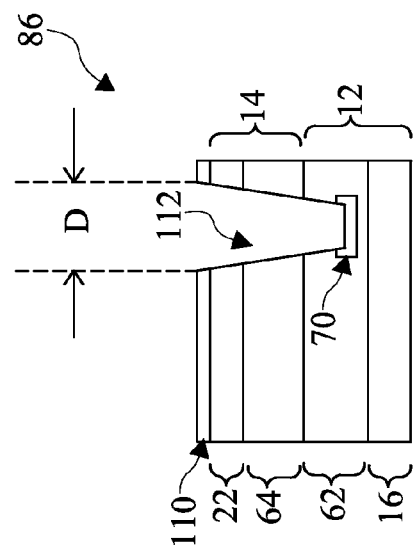

Referring to FIGS. 14 and 18, the method 88 proceeds to operation 96 by forming one or more TSV trench 112. Note the TSV trench refers to a trench and the TSV feature refers to the conductive feature formed in the TSV trench. The TSV trench 112 vertically extends from the second IC structure 14 to the first IC structure 12. Especially, the TSV trench 112 extends through the second substrate 22 and the second interconnect structure 64, and extends into the first interconnect structure 62 of the first IC structure 12. The TSV trench 112 has a width dimension ("D") in a top view toward the first substrate 16. In one example, the width dimension D of the TSV trench 110 ranges between about 5 micron and 15 micron. In another example, the width dimension d is about 10 micron. The TSV trench 112 is aligned with the metal line 70, and exposes the metal line 70.

The formation of the TSV trench 112 includes a lithography process and one or more etching processes. Since the second interconnect structure includes various metal features formed in one or more ILD material layers. The ILD material layers includes a suitable dielectric material, such as silicon oxide, silicon nitride, silicon oxynitride, polyimide, spin-on glass (SOG), fluoride-doped silicate glass (FSG), carbon doped silicon oxide, and low k dielectric material. The etching processes are designed to selectively etch the ILD material layers and silicon at respective etching steps when more than one etch step is implemented.

The formation of the TSV trench 112 is described below according to one embodiment. A lithography process is performed to form a patterned resist layer. An etching process is applied to etch the polishing stop layer 110, the silicon material of the second substrate 22, and the dielectric materials in the first and second interconnect structures. In one example, the etching process may include one etching step to etch through all material layers, or alternatively multiple etch steps tuned with to etch respective materials. In another embodiment, a hard mask layer is formed on the backside of the second substrate 22 and is patterned to form an opening that defines the region for the TSV trench 112. Thereafter, various material layers are patterned by one or more etching steps using the patterned hard mask layer as an etch mask. In yet another embodiment, the polishing stop layer 110 is first patterned to form an opening that defines the region for the through silicon via 112 by lithography process and etching. Thereafter, various material layers are patterned by one or more etching steps using the patterned polishing stop layer 110 as an etch mask. The etching process to form the TSV trench 112 stops on the metal line 70 by a mechanism, such as etching selectivity or control of the etching time.

Referring to FIGS. 14 and 19-21, the method 88 proceeds to operation 98 by forming one or more TSV feature. The TSV feature is a conductive feature formed in the TSV trench 112, providing electrical routing between the first and second IC structures 12 and 14.

Figure 19:
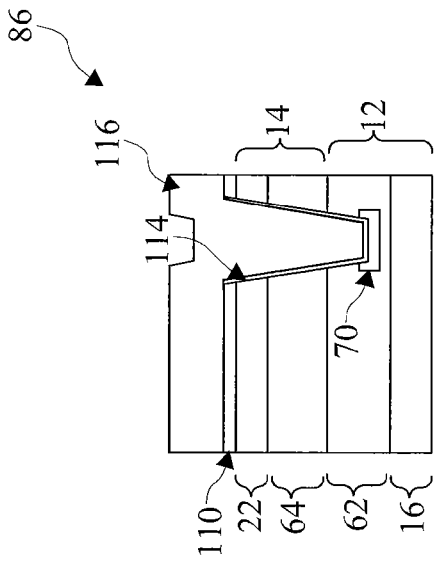

In one embodiment, a liner layer 114 is formed in the TSV trench 112 as illustrated in FIG. 19, particularly on the sidewalls of the TSV trench 112. The liner layer 114 includes a dielectric material to provide at least one of functions that include isolation, preventing diffusion and enhance adhesion. In one embodiment, the liner layer 114 includes silicon oxide formed by CVD or other suitable deposition technique.

Figure 20:
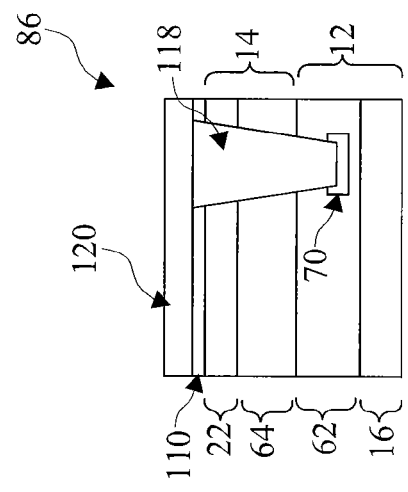

A conductive material layer 116 is filled in the TSV trench 112 on the liner layer 114, as illustrated in FIG. 20. The conductive material layer 116 may include metal (such as copper, aluminum or tungsten), metal alloy, or other suitable conductive material. The conductive material layer includes one or more conductive materials. In one embodiment, the conductive material layer 116 include copper formed by a procedure that includes a physical vapor deposition (PVD) process to form a copper seed layer and a plating process to form bulk copper on the copper seed layer. In furtherance of the embodiment, before the PVD deposition of the copper seed layer, a sputtering process is applied to the image sensor structure 86 to remove the process liner layer 114 formed on the bottom of the TSV trench such that the metal line 70 is exposed within the TSV trench.

Figure 21:
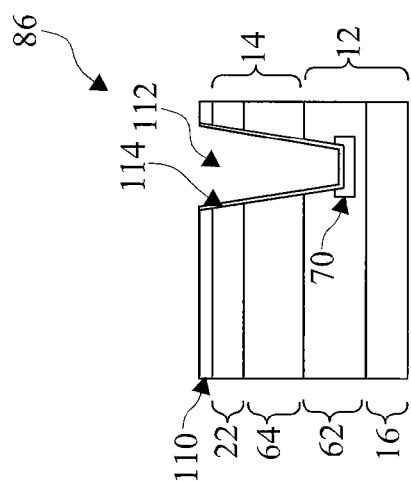

Thereafter, a CMP process is applied to the backside of the second substrate 22 remove the excessive conductive material and planarize the backside surface of the second substrate 22, thereby forming the TSV feature 118 as illustrated in FIG. 21. The CMP process is designed and tuned to stop on the polishing stop layer 110.

The method 88 may include other operations to form other conductive features that enable the electrical connection of the TSV feature 118 to the logic devices on the second IC structure 14. Accordingly, the image sensors in the first IC structure 12 and the logic devices in the second IC structure 14 are electrically coupled through the TSV feature 118. In one embodiment, conductive features (also referred to as metal traces) are formed on the backside of the IC structure 12 to be coupled with the second interconnect structure, by a suitable procedure, such as a damascene process. Alternatively, the metal traces are collectively formed with the TSV feature in s same procedure.

Figure 22:
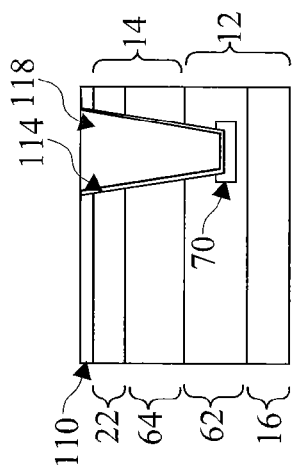

Referring to FIGS. 14 and 22, the method 88 includes an operation 100 by forming a passivation layer 120 on the second substrate 22. The passivation layer 120 includes one or more material layer to seal the 3D image sensor structure 86 from outside environment, such as preventing from outside moisture and other contaminations. In one embodiment, the passivation layer 120 includes silicon nitride formed CVD or other suitable method. In another embodiment, the passivation layer 120 includes a silicon oxide layer and a silicon nitride layer configured for effective passivation.

The method 88 may further include other operations to complete the formation of the 3D image sensor structure 86. In one example, the method 86 may include forming various features to enhance the imaging effect of the image sensors, such as forming color filter and micro-lenses on the backside of the first substrate. In another example, the method 88 may include a dicing process to form a plurality of 3D image sensor chips after the above operations are implemented in wafer level.

In another embodiment, the method 88 may include an operation by bonding a carrier substrate (such as another silicon wafer) to the 3D image sensor structure 86 to enhance the mechanical strength. In one example, the carrier substrate is bonded to the passivation layer 80 of the second substrate by a suitable bonding mechanism, such as fusion bonding or eutectic bonding.

In yet another embodiment, the method 88 may further include an operation to thin-down the first substrate after the bonding of the carrier substrate 80. The first substrate 16 is thinned down from the backside such that the thickness of the first substrate 16 is substantially reduced. Thereby, the image sensors formed in the first substrate 16 are able to receive image light more efficiently with reduced energy loss.

The present disclosed 3D image sensor structure and the method making the same are described in various embodiments. In another embodiment, the carrier wafer as the third substrate bonded to the 3D image sensor structure includes other logic circuit for further ISP function enhancement. For example, various logic devices including the driving devices to the image sensors are properly distributed in the logic substrate and the carrier wafer for more configuration freedom and design flexibility to enhance the performance of the 3D image sensor structure. In another embodiment of the disclosed structure and method, the driving devices to the image sensors are relocated on the logic substrate for image sensor performance improvement, such as the enlargement of quantum efficiency (QE) and full well capacity (FWC). In yet another embodiment, the image sensors in the 3D image sensor structure may be replaced by other sensors to employ the advantages of the 3D structure.

Different advantages may present in various embodiments. In one embodiment, image sensor pixel performance is improved through a fine-tuning process regardless of logic circuit since the logic circuit is independently formed in the logic circuit wafer before bonding to the image sensor wafer. Accordingly, the gross dies (the number of working dies) increases relative to those in the existing approach. Other advantages includes ISP function enhancement, and easy to extend to next generation process in various embodiments.

Thus, the present disclosure provides an embodiment of a method for fabricating a three dimensional (3D) image sensor structure. The method includes providing to an image sensor substrate having image sensors formed therein and a first interconnect structure formed thereon, and a logic substrate having a logic circuit formed therein and a first interconnect structure formed thereon; bonding the logic substrate to the image sensor substrate in a configuration that the first and second interconnect structures are sandwiched between the logic substrate and the image sensor substrate; and forming a conductive feature extending from the logic substrate to the first interconnect structure, thereby electrically coupling the logic circuit to the image sensors.

The present disclosure also provides one embodiment of an image sensor structure. The image sensor structure includes a first semiconductor substrate having a plurality of imaging sensors; a first interconnect structure formed on the first semiconductor substrate; a second semiconductor substrate having a logic circuit; and a second interconnect structure formed on the second semiconductor substrate. The first and the second semiconductor substrates are bonded together in a configuration that the first and second interconnect structures are sandwiched between the first and second semiconductor substrates. The image sensor structure further includes a through-semiconductor via (TSV) feature extended from the first interconnect structure to the second interconnect structure, thereby electrically coupling the logic circuit to the image sensors.

The present disclosure also provides another embodiment of a method for fabricating a three dimensional (3D) image sensor structure. The method includes providing an image sensor substrate having image sensors formed therein and a first interconnect structure formed thereon, and a logic substrate having a logic circuit formed therein and a first interconnect structure formed thereon; bonding the logic substrate to the image sensor substrate in a configuration that the first and second interconnect structures are sandwiched between the logic substrate and the image sensor substrate; thereafter, thinning-down the logic substrate; and thereafter, performing an etching process, thereby forming a backend deep contact (BDCT) feature that continuously extends from the logic substrate, through a first metal line in the second interconnect structure and contacts a second metal line in the first interconnect structure, the BDCT feature being electrically coupling the logic circuit to the image sensors.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for fabricating a three dimensional (3D) image sensor structure, comprising:
providing to an image sensor substrate having image sensors formed therein and a first interconnect structure formed thereon, and a logic substrate having a logic circuit formed therein and a second interconnect structure formed thereon;

bonding the logic substrate to the image sensor substrate in a configuration such that the first interconnect structure and the second interconnect structure are sandwiched between the logic substrate and the image sensor substrate;

after bonding the logic substrate to the image sensor substrate, performing a polishing process to thin-down the logic substrate, thereby removing a silicon oxide layer; and forming a conductive feature extending from the logic substrate to the first interconnect structure, thereby electrically coupling the logic circuit to the image sensors, wherein the forming of the conductive feature includes forming a backend deep contact (BDCT) feature that contacts a first metal line in the first interconnect structure and extends through a second metal line in the second interconnect structure.

2. The method of claim 1, wherein the forming of the conductive feature includes forming a through-semiconductor-via (TSV) feature.

3. The method of claim 2, wherein the forming of the TSV feature includes:
depositing a polishing stop layer on the logic substrate;
performing an etching process to the polishing stop layer, the logic substrate, the second interconnect structure and the first interconnect structure, thereby forming a trench therein;
forming a liner layer on sidewalls of the trench;
thereafter, filling the trench with a conductive material; and
performing the polishing process to the logic substrate to remove excessive conductive material, wherein the polishing process is a chemical mechanical polishing process.

4. The method of claim 3, further comprising forming a passivation layer on the logic substrate after the forming of the TSV feature.

5. The method of claim 4, wherein
the forming of the passivation layer includes forming a silicon nitride layer; and
the forming of the liner layer includes the silicon oxide layer by chemical vapor deposition.

6. The method of claim 3, wherein
the forming of the liner layer includes forming the silicon oxide layer by chemical vapor deposition; and
the filling of the trench includes forming a copper seed layer by physical vapor deposition and forming a bulk copper in the trench by plating.

7. The method of claim 3, wherein the trench extends from the second interconnect structure to the first interconnect structure.

8. The method of claim 3, wherein the trench extends through the logic substrate and the second interconnect structure.

9. The method of claim 1, wherein the forming of the BDCT feature includes:
forming a passivation layer on the logic substrate;
bonding a carrier substrate to the passivation layer; and
thinning down the image sensor substrate.

10. A method for fabricating a three dimensional (3D) image sensor structure, comprising:
providing an image sensor substrate having image sensors formed therein and a first interconnect structure formed thereon, and a logic substrate having a logic circuit formed therein and a second interconnect structure formed thereon;

bonding the logic substrate to the image sensor substrate in a configuration that the first interconnect structure and second interconnect structure are sandwiched between the logic substrate and the image sensor substrate;

after bonding the logic substrate, thinning-down the logic substrate by performing a polishing process; and after performing the polishing process, performing an etching process, thereby forming a backend deep contact (BDCT) feature that continuously extends from the logic substrate, through a first metal line in the second interconnect structure and contacts a second metal line in the first interconnect structure, the BDCT feature being electrically coupling the logic circuit to the image sensors.

11. A method for fabricating a three dimensional (3D) image sensor structure, comprising:
receiving a first semiconductor substrate having a plurality of imaging sensors and a first interconnect structure formed on the first semiconductor substrate;
receiving a second semiconductor substrate having a logic circuit and a second interconnect structure formed on the second semiconductor substrate;
forming a through-semiconductor via (TSV) feature in the second substrate, coupled to the second interconnect structure;
bonding the first semiconductor substrate and the second semiconductor substrate together in a configuration such that the first interconnect structure and the second interconnect structure are sandwiched between the first semiconductor substrate and the second semiconductor substrate, wherein the TSV feature couples to the first interconnect structure, thereby electrically coupling the logic circuit to the image sensors, wherein the TSV feature extends from the second interconnect structure to the first interconnect structure in a first direction;
performing a polishing process to thin-down the second semiconductor substrate; and
forming a conductive feature in the second interconnection structure, the conductive feature contacting the TSV feature.

12. The method of claim 11, wherein the TSV feature includes a dimension ranging between about 5 micron and about 15 micron in a second direction orthogonal to the first direction.

13. The method of claim 12, wherein the first interconnect structure includes a metal line in one metal layer; and the TSV feature contacts the metal line.

14. The method of claim 13, wherein the TSV feature extends through the second semiconductor substrate and is coupled to the logic circuit though other conductive features formed in the second interconnect structure.

15. The method of claim 12, wherein the TSV feature includes a conductive material layer selected from the group consisting of copper, tungsten, aluminum, and a combination thereof.

16. The method of claim 11, wherein the image sensors include photodiodes; and the logic circuit includes driving devices to drive the image sensors.

17. The method of claim 16, wherein the image sensors further include transfer gates formed on and coupled with the photodiodes, respectively; and the driving devices includes a reset (RST) device, a source follower (SF) and a row selector (RS).

18. The method of claim 11, further comprising:
providing a third semiconductor substrate bonded to the second semiconductor substrate, wherein the first, second and third semiconductor substrates are silicon substrates.

19. The method of claim 11, wherein forming the TSV feature comprises:
depositing a polishing stop layer on the second semiconductor substrate;
performing an etching process, thereby forming a trench;
forming a liner layer on sidewalls of the trench;
filling the trench with a conductive material; and
removing excessive conductive material.

20. The method of claim 11, further comprising:
forming a passivation layer on the second semiconductor substrate after forming the TSV feature.

* * * * *